United States Patent [19]
Tauber et al.

[11] Patent Number: 5,340,799
[45] Date of Patent: Aug. 23, 1994

[54] HIGH CRITICAL TEMPERATURE SUPERCONDUCTOR (HTSC) INCLUDING A RARE EARTH ALKALI METAL TITANATE AS AN OXYGEN DIFFUSION BARRIER IN THE DEVICE

[75] Inventors: Arthur Tauber, Elberon; Steven C. Tidrow, Eatontown, both of N.J.

[73] Assignee: The United States of America as represented by the Secretary of the Army, Washington, D.C.

[21] Appl. No.: 88,297

[22] Filed: Jun. 18, 1993

[51] Int. Cl.$^5$ ............................................. B32B 9/00
[52] U.S. Cl. ................................. 505/237; 505/701; 505/702; 505/238; 428/688; 428/689; 428/701; 428/702
[58] Field of Search .................. 505/1, 701, 702, 703, 505/704; 428/688, 209, 433, 701, 702, 689, 690

[56] References Cited
U.S. PATENT DOCUMENTS

| | | | |
|---|---|---|---|
| 5,024,894 | 6/1991 | Chien | 428/433 |
| 5,157,017 | 10/1992 | Jin | 505/1 |
| 5,168,420 | 12/1992 | Ramesh | 505/1 |

OTHER PUBLICATIONS

"Paths to Higher Temperature Superconductors", Gabelle, Science, vol. 259, Mar. 12, 1993, pp. 1551–1552.
Howard, Appl. Phys. Lett. 33(12), Dec. 15, 1978, pp. 1034–1035.
Wiener Avnear et al, Appl. Phys. Lett 56(18), Apr. 30, 1990 pp. 1802–1805.
Jaffe et al. "Piezoelectric Ceramics", Academic Press, 1971, pp. 90–99.
Galasso, "Structure and Properties of Inorganic Solids" Pergamon Press, 1971 pp. 178–179.
"Superconductors' Material Problems", Science, vol. 240, pp. 25–27.

*Primary Examiner*—Patrick J. Ryan
*Assistant Examiner*—Patrick Jewik
*Attorney, Agent, or Firm*—Michael Zelenka; Roy E. Gordon

[57] ABSTRACT

Rare-earth alkaline metal titanates are used as buffer layers substrates, and oxygen diffusion barriers for the growth of high critical temperature superconductors, ferroelectrics, pyroelectrics and piezoelectrics.

9 Claims, No Drawings

HIGH CRITICAL TEMPERATURE SUPERCONDUCTOR (HTSC) INCLUDING A RARE EARTH ALKALI METAL TITANATE AS AN OXYGEN DIFFUSION BARRIER IN THE DEVICE

GOVERNMENT INTEREST

The invention described herein may be manufactured, used, and licensed by or for the Government for governmental purposes without the payment to us of any royalties thereon.

FIELD OF INVENTION

The invention relates in general to high critical temperature superconductor devices and in particular to the use of rare earth alkali metal titanates as oxygen diffusion barriers in such devices.

BACKGROUND OF THE INVENTION

Heretofore, one of the most popular of the buffer layers and substrates of single and multilayer high critical temperature superconductor structures has been $LaAlO_3$. The difficulty with $LaAlO_3$ however, is that it has several deficiencies including twinning, strain, anisotropic dielectric properties, non-ideal lattice match, and intermediate to rapid oxygen diffusion.

SUMMARY OF THE INVENTION

The general object of this invention is to provide single and multilayer high critical temperature superconducting structures for device applications. A more particular object of the invention is to provide such a structure wherein it is possible to trap oxygen into the superconducting structure such that the superconducting characteristics are the same after subsequent deposition of additional dielectric or buffer/superconducting layer(s). A still further object of the invention is to improve the substrate, buffer dielectric/capping/passivation layers, and oxygen diffusion barrier of these single and multilayer superconducting structures so that superconducting characteristics can be further improved.

It has now been found that the foregoing objects can be attained by including a rare-earth alkali titanate as the buffer layer(s) and/or substrate and/or oxygen diffusion barrier of the multilayer superconducting structure. Rare-earth alkali titanates that can be used in the invention include $LaLiTi_2O_6$, $LaNaTi_2O_6$, $LaK_{0.96}\Delta_{0.04}Ti_2O_6$, $NdKTi_2O_6$, $NdNaTi_2O_6$, $NdLiTi_2O$ $PrLiTi_2O_6$, $PrNaTi_2O_6$, $PrKTi_2O_6$, $SmLiTi_2O_6$, $SmNaTi_2O_6$, $SmKTi_2O_6$, $LaCs_{0.4}\Delta_{0.58}Ti_2O_6$, $LaRb_{0.66}\Delta_{0.44}Ti_2O_6$, $LaAg_{0.65}\Delta_{0.35}Ti_2O_6$, $LaTl_{0.97}\Delta_{0.03}Ti_2O_6$, $CeKTi_2$, $O_6$ and $EuTiO_3$, where $\Delta$ is a vacancy. The use of the rare-earth alkali titanates allows growth of fully oxygenated multilayer high critical temperature superconducting, ferroelectric, pyroelectric and piezoelectric structures and hybrid structures even when high temperature, low oxygen deposition processing is used.

By the term single layer as used herein is meant one layer of HTSC that is deposited on a single crystal substrate of rare earth alkali metal titanate.

The term single layer also means one layer of HTSC deposited on a substrate other than a rare earth alkali metal titanate that then requires a buffer layer of rare earth alkali metal titanate.

The term single layer can also mean either of the foregoing with a capping layer when the substrate is not a rare earth alkali metal titanate, then a buffer of rare earth alkali metal titanate and then an HTSC layer.

By the term multilayer as used herein is meant at least two layers of HTSC such that one layer is deposited as described in "single layer" and subsequent layers are deposited on an intervening layer of rare earth alkali metal titanate that is deposited on a previous HTSC layer.

The high critical temperature superconductors will not lose oxygen below about 400° C. and normal deposition pressures that in the case of laser ablation is about 150 mTorr. Because the rare-earth alkali metal titanates are oxygen diffusion barriers, the rare-earth alkali metal titanates allow for growth of single and multilayer high critical temperature superconductors that can have their properties locked in by subsequently depositing an overlying buffer layer at low temperature and oxygen deposition pressures between $1 \times 10^{-5}$ Torr to 0.2 Torr. Since the rare-earth alkali metal titanates do not rapidly diffuse oxygen at high temperatures another high critical temperature superconducting layer as for example a layer of $YBa_2Cu_3O_{7-d}$ (YBCO) can be deposited on this structure; hence, multilayer structures can be made with reproducible properties. Other barrier materials that may rapidly diffuse oxygen require prohibitively longer anneals as the thickness of each layer or thickness of the total structure increases; hence, reproducible properties become more difficult and even impossible.

Expansion coefficients of the substrate, buffer or dielectric material are also important for growth of single and multilayer structures involving high critical temperature superconductors, ferroelectric, pyroelectrics and piezoelectrics and hybrids for novel devices.

DESCRIPTION OF THE PREFERRED EMBODIMENT

Preparation of thin films or layers of the rare-earth alkali metal titanate can be carried out by pulsed laser deposition (PLD) that first involves the preparation of targets. The targets can be conveniently prepared by weighing out stoichiometric amounts of rare-earth oxides, alkali metal carbonate and titanium oxide. These are mixed together using a combination of mills and hand grinding in a boron carbide mortar. The milled mixtures are pressed into one inch discs and calcined at 800° C. for 15 hours in air. The discs are ground to a powder of approximately 100 $\mu$m average size and repressed and calcined again at 1000° C. for 10 hours in air. The discs are ground again to an average particle size of about 100 $\mu$m. The powder is pressed into a 1.25 inch diameter die at 8000 psi, repressed isostatically at 50,000 psi, and then sintered at 1200° C. to 1500° C. hour in air and then cooled to room temperature. The resulting discs are approximately one inch in diameter and 0.25 inch thick and can be used as targets in a laser ablation system.

That is, one method of preparing epitaxial thin films is by the pulsed laser deposition (PLD) technique. Epitaxial rare-earth titanate films can be deposited over a range of temperatures, pressures and deposition rates by PLD. In fact, crystal structure and film orientation can be controlled by controlling the film deposition temperature, pressure and deposition rate. For instance, the X-ray data for a film of $LaNaTi_2O_6$ on an oriented MgO substrate, grown by PLD at: an oxygen pressure of 150 mTorr; an inconel substrate heater block temperature of 500° C.; and a laser fluence of 1 to 2 $J/cm^2$ at the target using a 248 nm wavelength KrF laser, 300 mJ/pulse and a repetition rate of 10Hz shows an X-ray line at 45.5° or a d- spacing of 2.31 Å using a Co radiation source. This does not correspond to the $LaNaTi_2O_6$ cubic unit cell of $a=b=c=3.89$ Å; however, it may well correspond to a $LaNaTi_2O_6$ superlattice of twice the unit cell as X-ray lines of d about 7.8 Å have been seen for several titanate compounds.

The epitaxial nature of the $LaNaTi_2O_6$ film can be improved by depositing onto MgO at; an oxygen pressure of 147 mTorr, an inconel substrate heater block temperature of 810° C.; and a laser fluence of 1 to 2 $J/cm^2$ at the target using a 248 run wavelength KrF laser, 300 mJ/pulse, repetition rate 10Hz as shown by the (001) $2\theta=26.5°$ or d- spacing 3.89 Å and (002) $2\theta=54.5°$ or d- spacing 1.95 Å peaks corresponding to a $LaNaTi_2O_6$ cubic unit cell of $a=b=c=3.89$ Å. It can also be noted that X-ray lines at about $2\theta$: 44.3° or a d-spacing of 2.37 Å and about $2\theta=54.5°$ or d- spacing 1.95 Å peaks corresponding to a $LaNaTi_2O_6$ cubic unit cell of $a=b=c=3.89$ Å. It can also be seen that X-ray lines at about $2\theta=45.5°$ or a d- spacing of 2.31 Å are also present and can be indexed to a $LaNaTi_2O_6$ superlattice of twice the unit cell. The X-ray data for a $LaNaTi_2O_6$ film on an (001) oriented MgO substrate, grown by PLD at: an oxygen pressure of 25 mTorr, an inconel substrate heater block temperature of 800° C.; and a laser fluence of 1 to 2 $J/cm^2$ at the target (using a 248 nm wavelength KrF laser, 300 m J/pulse, repetition rate 10Hz shows a (110) preferred orientation as shown by the peaks at $2\theta=38.1°$ or d- spacing 2.74 Å and (220) $2\theta=81.1°$ or d- spacing 1.75A. It can also be seen that there is partial (001) orientation as shown by the peaks at $2\theta=26.5°$ or d- spacing 3.89 Å and $2\theta=54.5°$ or d-spacing 1.95 Å and also that the lines again appear at $2\theta=44.3°$ or d- spacing 2.37 Å and $2\theta=45.5°$ or d-spacing 2.31 Å and probably correspond to a superlattice.

Crystalline films can even be grown on MgO at 350° C. and a deposition atmosphere of $5 \times 10^{-5}$ torr. This is important since the rare-earth titanates do not readily diffuse oxygen and since high critical temperature superconductors are fully oxygenated under such deposition conditions; it should be possible to trap oxygen into the superconducting structure such that the superconducting characteristics are the same after subsequent deposition of additional buffer, and superconducting layer(s).

Buffer layers of $LaLiTi_2O_6$ and $LaNaTi_2O_6$ films have been deposited on MgO substrates. YBCO films subsequently deposited on top of these buffer layers typically exhibit better superconducting properties than films deposited directly on MgO substrates. In fact, the YBCO superconducting transitions and transition widths are comparable to YBCO films deposited onto $LaAlO_3$ substrates that are presently the most accepted material for growth of high temperature superconducting thin films.

In addition, $LaLiTi_2O_6$ and $LaNaTi_2O_6$ films have been used to buffer single crystal but randomly cut $Al_2O_3$ (sapphire) substrates. YBCO films subsequently deposited on these buffer layers show reasonably good superconducting characteristics with $T_c$ typically greater than 84K and $\Delta T_c$ less than 10K. By continuing to improve growth conditions of these buffer layers, superconducting characteristics can be further improved.

Now, by depositing a rare earth $TiO_3$ layer on the HTSC single layer using the same deposition conditions as before and then subsequently depositing a HTSC layer on top of this rare earth alkali metal titanate layer using the same conditions as before, an HTSC multilayer structure is fabricated.

We wish it to be understood that we do not desire to be limited to the exact details of construction shown and described for obvious modification will occur to a person skilled in the art.

What is claimed is:

1. A superconductor device including a substrate and at least one layer of $Y_1Ba_2Cu_3O_{7-x}$ where x has a value of from 0.0 to 0.75 deposited on the substrate, and wherein each layer of $Y_1Ba_2Cu_3O_{7-x}$ where x has a value of from 0.0 to 0.75 alternates with a rare earth alkali metal titanate oxygen diffusion barrier and wherein the rare earth alkali metal titanate is selected from the group consisting of $LaLiTi_2O_6$, $LaNaTi_2O_6$, $LaK_{0.96}\Delta_{0.04}Ti_2O_6$, $SmLiTi_2O_6$, $SmKTi_26$, $LaCs_{0.42}\Delta_{0.58}Ti_2O_6$, $LaRb_{0.66}\Delta_{0.34}Ti_2O_6$, $LaAg_{0.65}\Delta_{0.35}Ti_2O_6$, $CeKTi_2O_6$, and $EuTIO_3$ where $\Delta$ is an alkali metal vacancy. and $EuTIO_3$ where $\Delta$ is an alkali metal vacancy.

2. A superconductor device according to claim 1 wherein the rare earth alkali metal titanate oxygen diffusion barrier is a substrate.

3. An superconductor device according to claim 1 wherein the rare earth alkali metal titanate oxygen diffusion barrier is a buffer layer.

4. A superconductor device according to claim 1 wherein the rare-earth alkali metal titanate is $LaLiTi_2O_6$.

5. An A high critical temperature superconductor device according to claim 2 wherein the $LaLiTi_2O_6$ is deposited on an MgO substrate.

6. An A superconductor device according to claim 2 wherein $LaLiTi_2O_6$ is deposited on an $Al_2O_3$ substrate.

7. An A superconductor device according to claim 1 wherein the rear-earth alkali metal titanate is $LaNaTi_2O_6$.

8. An A superconductor device according to claim 2 wherein $LaNaTi_2O_6$ is deposited on an MgO substrate.

9. An A superconductor device according to claim 2 where $LaNaTi_2O_6$ is deposited on a sapphire substrate.

* * * * *